United States Patent
Okuda et al.

(10) Patent No.: US 6,876,761 B1
(45) Date of Patent: Apr. 5, 2005

(54) JIG FOR CALIBRATING COMPONENT RECOGNITION APPARATUS, COMPONENT RECOGNITION CALIBRATING METHOD USING THE JIG, AND COMPONENT MOUNTING APPARATUS USING THE JIG

(75) Inventors: Osamu Okuda, Yamanashi-ken (JP); Yoshihiro Yoshida, Neyagawa (JP); Atsushi Tanabe, Yamanashi-ken (JP); Akira Kabeshita, Hirakata (JP); Naoyuki Kitamura, Yamanashi-ken (JP); Kazuo Mori, Kofu (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/130,018

(22) Filed: Aug. 6, 1998

(30) Foreign Application Priority Data

Aug. 8, 1997 (JP) ............................................. 9-214454
Jul. 3, 1998 (JP) .......................................... 10-188416

(51) Int. Cl.⁷ ................................................. G06K 9/00
(52) U.S. Cl. ...................... 382/151; 356/399; 228/105
(58) Field of Search ................................. 382/145, 148, 382/151, 181, 289, 291; 348/87, 95; 250/559.3, 559.34; 702/94, 95, 159; 356/138, 139.03, 399; 228/103, 104, 105, 180.21

(56) References Cited

U.S. PATENT DOCUMENTS 5,667,129 A * 9/1997 Morita et al. ................ 228/102
6,138,892 A * 10/2000 Kim et al. .................... 228/102

FOREIGN PATENT DOCUMENTS

JP 6-85494 * 3/1994

* cited by examiner

Primary Examiner—Samir Ahmed
(74) Attorney, Agent, or Firm—Wenderoth, Lind & Ponack, L.L.P.

(57) ABSTRACT

A calibration jig for a component recognition device and a component recognition calibration method using the jig which can stabilize the mounting accuracy of a component to a to-be-mounted object and improve amount quality. An opening is formed at a to-be-picked up face of the calibration jig. A predetermined position of the calibration jig is recognized on the basis of the contrast between the picked-up face and the opening. The position of the calibration jig can be recognized with higher accuracy, so that a resolution of the component recognition device, etc. can be obtained with a higher degree of accuracy. Mount accuracy of the component to the object is thus stabilized and mount quality is improved.

20 Claims, 10 Drawing Sheets

JIG FOR CALIBRATING COMPONENT RECOGNITION APPARATUS, COMPONENT RECOGNITION CALIBRATING METHOD USING THE JIG, AND COMPONENT MOUNTING APPARATUS USING THE JIG

BACKGROUND OF THE INVENTION

The present invention relates to a calibration jig for calibrating a component recognition device picking up images of components, and a component recognition calibration method using the calibration jig, and a component mounting apparatus handling the calibration jig. Electronic components are an example of the above component.

These days, electronic circuit boards are required to be improved in mount quality with electronic components mounted correctly.

An example of a conventional electronic component mounting apparatus will be described hereinbelow with reference to FIGS. 15–20. A conventional electronic component mounting apparatus is shown in FIG. 15 and includes a board transfer device 42 for carrying in and out circuit boards 41, a component feed device 44, an XY robot 45 which is equipped with a nozzle 46 and a board recognition camera 49 and movable in X, Y directions, and an electronic component recognition camera 47.

The structure of the component recognition camera 47 is indicated in FIG. 16. It is a calibration jig 51 that is held at a leading end of the nozzle 46. The component recognition camera 47 is equipped with, for the purpose of picking up images of components, an LED illuminator 52 for illuminating a component held by the nozzle 46, a mirror 54 and a lens 55 arranged on an optical path of the LED illuminator 52 reflected by the component, and a CCD camera 56 for receiving a light passing through the lens 55. In FIG. 16, a light of the LED illuminator 52 reflected by the calibration jig 51 is condensed by the lens 55 via the mirror 54, so that an image of the calibration jig 51 is picked up by the CCD camera 56. The reference numeral 53 represents an optical axis.

A resolution of the component recognition camera 47, and at the same time, how to measure an inclination of the component recognition camera 47 to the X, Y directions in which the XY robot 45 moves, and a center position of the component recognition camera 47 will be explained below. Since the nozzle 46 is rotatable about its axis, the center position of the camera is easily detected by the following method. That is, each of the images of the calibration jig 51 is obtained by rotating the jig 51 every 90° through the rotation of the nozzle 46 every 90° about the axis, and then four centroids corresponding to the respective images are taken and thus a center of the four centroids is considered as a rotational center of the nozzle 46. For the resolution and inclination of the camera, as shown in FIG. 17, the calibration jig 51 is moved in X, Y directions in the vicinity of an outline of a recognition view field 47a of the component recognition camera 47, thereby measuring the resolution and inclination from a move amount of the calibration jig 51 over the recognition camera 47 and a move amount of the XY robot 45.

The operation of the conventional electronic component mounting apparatus 1, constituted as above, will be described below. The circuit board 41 is carried to a mount position by the board transfer device 42. The XY robot 45 moves the board recognition camera 49 to a position above the circuit board 41 and seeks a position 43 where an electronic component is to be mounted on the circuit board 41. Then, the XY robot 45 moves the board recognition camera 46 to a position above the component feed device 44 to recognize the electronic component to be held, and lets the nozzle 46 hold the electronic component 48. An attitude of the component 48 held by the nozzle 46 is picked up by the component recognition camera 47. The position of the component is corrected on the basis of the obtained image information, and then the electronic component 48 is mounted onto the circuit board 41.

The electronic component 48 held by the nozzle 46 of the XY robot 45 is moved in X, Y directions by the XY robot 45. Meanwhile, X, Y directions of a coordinate system in the image obtained by the component recognition camera 47 recognizing the attitude of the electronic component 48 held by the nozzle 46 are different from the X, Y directions as the movement directions of the XY robot 45. Although the component recognition camera 47 is set so that the X, Y directions of the coordinate system of the component recognition camera 47 agree with the X, Y directions of the XY robot 45, a slight offset is actually present between the directions. Thus, the electronic component 48 held by the nozzle 46 cannot be mounted correctly to the circuit board 41 unless the offset is calibrated. In other words, the measurement of the resolution, inclination and center position of the component recognition camera 47, i.e., calibration of the board recognition camera 49 is important in order to correctly mount the electronic component 48 onto the circuit board 41.

FIG. 18 shows a state where the calibration jig 51 is picked up by the board recognition camera 49. FIG. 19 indicates a luminance level of an image obtained by slicing an image of FIG. 18 in the X direction, while FIG. 20 is a luminance level of an image obtained by slicing the image of FIG. 18 in the Y direction.

As is shown in FIG. 16, the LED illuminator 52 irradiates a flat face 57 of the calibration jig 51, and therefore the component recognition camera 47 picks up the flat face 57. It is important for the calibration of the component recognition camera 47 to clearly and stably photograph an outline of the flat face 57. At this time, an edge part of the flat face 57 photographed by the component recognition camera 47, namely, a perpendicular part 50 extending in a direction orthogonal to the flat face 57 is not always in parallel to the photographed optical axis 53. While the calibration jig, 51 is manufactured to make the perpendicular part 50 as small as possible, the calibration jig 51 is easy to break if its shape is minimal. As such, the perpendicular part 50 is given a certain margin of length. The light projected from the LED illuminator 52 irradiates the perpendicular part 50 as well and a faint light reflected at the perpendicular part 50 is picked up by the CCD camera 56 which is represented by a reference numeral 58 in FIG. 18. As shown in FIGS. 19 and 20, an intensity of the reflecting light at the flat face 57 of the calibration jig 51 is high, and therefore the flat face 57 is photographed with a high gain by the CCD camera 56, assuming a high luminance level. A shape of the flat face 57 is accordingly detected clearly. On the other hand, the perpendicular part 50 with a low intensity of the reflecting light assumes a low luminance level and is not clear in contrast as designated by luminances 59, 60 in FIGS. 19 and 20. As a result, the outline of the calibration jig 51 is not clear in the image obtained by the component recognition camera 47.

In the above state with the luminances 59 and 60 brought about, a position of the calibration jig 51 when rotated for measuring the center position of the camera, or a position of the calibration jig 51 when held by the nozzle 46 cannot be recognized easily, thus hindering stable measurement of the resolution, inclination and center position of the component recognition camera 47.

As discussed hereinabove, the offset of the component recognition camera 47 cannot be correctly measured according to the conventional calibration jig 51, and consequently the component recognition camera 47 cannot be calibrated correctly, whereby the electronic component. 48 cannot be correctly and stably mounted to the circuit board 41.

SUMMARY OF THE INVENTION

The object of the present invention is therefore to provide a calibration jig for a component recognition device and a component recognition calibration method using the jig whereby an offset and a scale of a component recognition camera can be correctly calibrated, thereby stabilizing the mounting accuracy of components to a to-be-mounted object and improving mount quality, and a component mounting apparatus handling the calibration jig.

In order to achieve the aforementioned objective, according to a first aspect of the present invention, there is provided a calibration jig for a component recognition device to be used in making a coordinate system within a view field of the component recognition device provided for confirming an attitude of a component before the component is mounted to a to-be-mounted object, agree with a coordinate system of a component holding device for holding and mounting the component to the object.

The calibration jig comprises a recognition part set at a flat face, which is to be picked-up, for reflecting light to be picked up by the component recognition device, arranged inside a periphery of the picked-up face, having a light reflectance different from that of the picked-up face, and for obtaining a point to be measured of the picked-up face which is a point necessary for the agreement of the coordinate systems.

According to a second aspect of the present invention, there is provided a component recognition calibration method using the calibration jig for the component recognition device.

The method comprises:

illuminating the picked-up face of the calibration jig;

recognizing the recognition part by the component recognition device thus operating a position of the recognition part;

calculating a resolution of the component recognition device on a basis of a result of the operation; and calculating a rotational angle representing a shift of the coordinate system of the component recognition device to the coordinate system of the component holding device.

The calculating the resolution of the component recognition device and the rotational angle may comprise:

obtaining the point to be measured of the calibration jig on the basis of the position of the recognition part obtained through the operation;

thereafter, moving the calibration jig over the component recognition device in X, Y directions orthogonal to each other on a plane;

calculating the resolution of the component recognition device from a movement distance of the point to be measured and an actual movement distance, the movement distance being obtained by the component recognition device based on a locus of the point to be measured; and calculating the rotational angle from a shift of a movement direction in the X or Y direction of the point to be measured to a regulated X-axis or Y-axis.

According to the calibration jig for the component recognition device in the first aspect and the component recognition calibration method in the second aspect of the present invention, the recognition part is provided at the to-be-picked-up face and a predetermined position of the calibration jig is recognized on the basis of a contrast between the picked-up face and the recognition part. Thus, in comparison with the prior art in which the position of the calibration jig is recognized on the basis of an outline of the calibration jig, in the present invention the position of the calibration jig can be recognized with a higher degree of accuracy. The resolution, etc. of the component recognition device calculated through the recognition of the predetermined position of the calibration jig are more highly accurate than in the prior art, and accordingly the accuracy of mounting the component to the to-be-mounted object is stabilized and mount quality is improved.

A component mounting apparatus provided according to a third aspect of the present invention uses the calibration jig for the component recognition device of the first aspect.

Since the component mounting apparatus of the third aspect uses the calibration jig for the component recognition device of the first aspect, the resolution, etc. of the component recognition device can be obtained more highly accurately, so that mount accuracy for the component to the to-be-mounted object is stabilized and mount quality is improved.

BRIEF DESCRIPTION OF THE DRAWINGS

These and other objects and features of the present invention will become clear from the following description taken in conjunction with the preferred embodiment thereof with reference to the accompanying drawings, in which.

DETAILED DESCRIPTION OF THE PREFERRED EMBODIMENT

Figure 1:
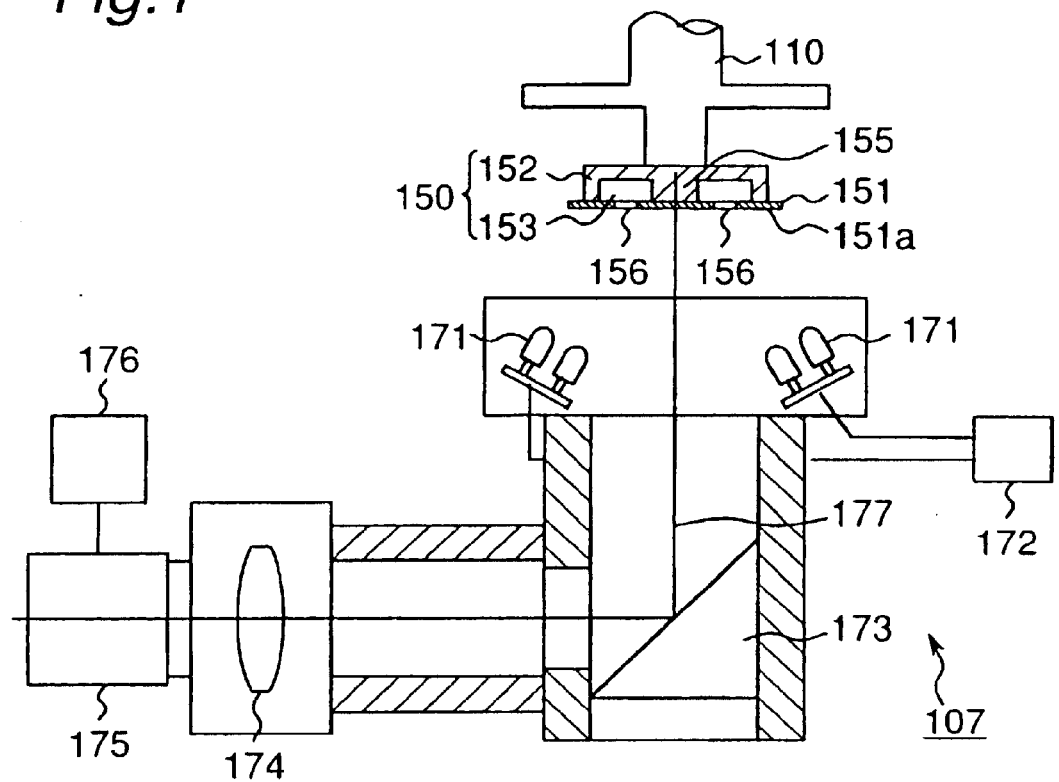
FIG. 1 is a sectional view of a calibration jig in an embodiment of the present invention, along with showing the construction of a component recognition device.

A calibration jig for a component recognition device in one embodiment of the present invention, a component recognition calibration method carried out with the use of the calibration jig, and a component mounting apparatus handling the calibration jig will be described with reference to the drawings throughout which like parts are designated by like reference numerals.

According to the embodiment, a component mounting apparatus is employed by way of example which holds an electronic component as a component by means of a nozzle of a component holding device, and automatically mounts the electronic component onto a circuit board. The component recognition device described in the foregoing "SUMMARY OF THE INVENTION" corresponds to a device provided in the above component mounting apparatus and picks up an image of an attitude of the electronic component held by the nozzle. The calibration jig for the component recognition device according to the embodiment is a jig used for calibrating a center position of a to-be-picked-up face of a camera of the component recognition device, a resolution and an inclination of the component recognition device. An example exerting a function of the "recognition part" in the "SUMMARY OF THE INVENTION" corresponds to an opening 156 of the embodiment.

First, the calibration jig for the component recognition device will be described. As shown in FIG. 1, a calibration jig 150 for the component recognition device according to the present embodiment consists of a rectangular thin plate 151 and a reinforcing member 152 for reinforcing the thin plate 151.

Figure 2:
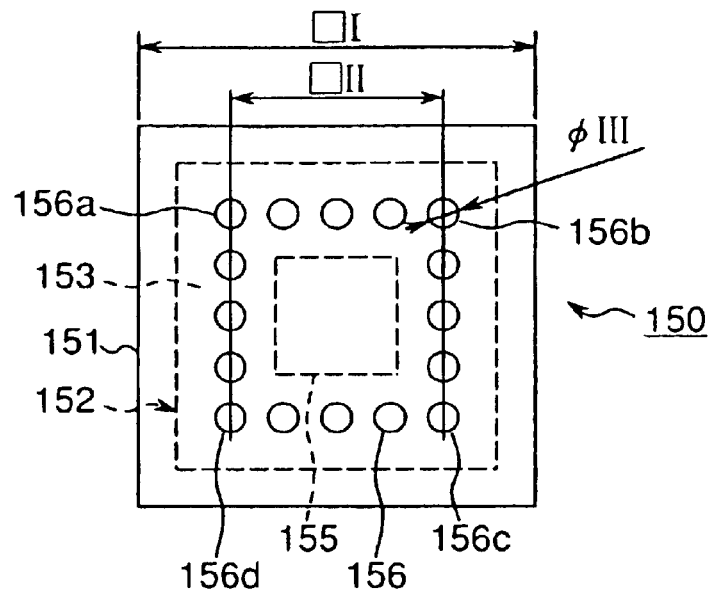
FIG. 2 is a plan view of the calibration jig of FIG. 1.

The thin plate 151 is formed as thin as possible so as to restrain a light from being reflected at a side face in a thicknesswise direction of the thin plate 151, as small as possible, when a pickup performance is executed by the component recognition device 107. A plurality of openings 156 penetrating the thin plate 151 are arranged to be conformable in outline to the thin plate 151, as is clear from FIG. 2. Although the openings 156 are circular in the embodiment, the shape thereof is not limited to this and can be rectangular or the like so long as a center position of each opening can be detected from a picked-up image of the component recognition device 107. As will be described later, the openings 156 are formed to obtain a point-to-be measured of the calibration jig 150 to measure a resolution of a CCD camera 175 at the component recognition device 107, a rotational angle of the component recognition device 107 and a center position of a view field of the CCD camera 175 which are basic data to correct a movement amount of a component holding device 106, etc. The rotational angle of the component recognition device 107 is an offset angle of X axes or Y axes between an XY coordinate system of the component holding device 106 and an XY coordinate system in the view field of the CCD camera 175 when origins of both coordinate systems are agreed on the same plane. Therefore, at least four openings 156, namely, 156a–156d are preferably arranged so as to correspond to at least four corners of the rectangular shape as in the embodiment. For the purpose of obtaining the point-to-be measured, however, it is enough to form at least one opening at an optional position of the thin plate 151. Since the point-to-be measured is a center point of the thin plate 151 in the embodiment as will be described later, in the event only one opening is formed, that is, unless four openings are formed correspondingly to the four corners, the thin plate 151 should be rotated four times every 90° about a rotational axis of a nozzle 110 to be described later, thereby obtaining four points from a center of an area of the opening at each of four places where the opening is located respectively and detecting the center point of the thin plate 151, for example, from an intersection of diagonals or by the like manner based on the four points.

Although the recognition part is preferred to be the openings 156 as in the embodiment, a black figure may be plotted by printing or the like manner to a to-be-picked-up face 151a if a penumbra can be picked up clearly in the image of the component recognition device 107.

The thin plate 151 in one embodiment is formed of approximately 0.1–0.2 mm thick, square stainless with each side having an I size of 20 mm. The picked-up face 151a by the component recognition camera 107 is satin finished so as to reflect the light from an LED illuminator 171 of the component recognition device 107 well and show good contrast to the openings 156. Meanwhile, each opening 156 has a diameter of 0.2–0.4 mm. The openings 156 are arranged with a pitch of 1.0 mm within a tolerance of ±0.005 mm in a square shape of one side of a II size of 16 mm. The diameter of the opening 156 is preferably approximately twice the thickness of the thin plate 151.

Figure 9:
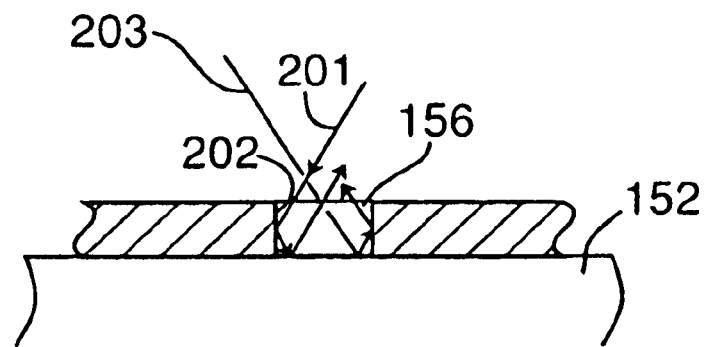
FIG. 9 is a diagram of a reflection state of light without a groove provided at an opening part of the calibration jig of FIG. 1.
Figure 10:
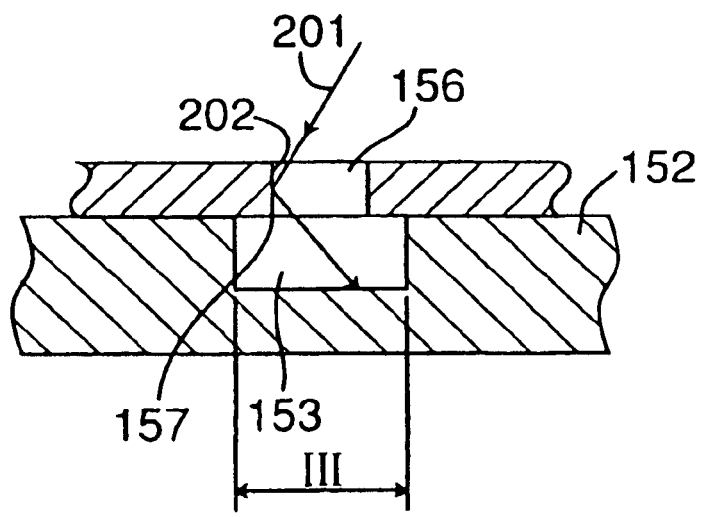
FIG. 10 is a diagram of the reflection state of light with a groove provided at the opening part of the calibration jig of FIG. 1.

As indicated in FIG. 1, the reinforcing member 152 has a rectangular shape that is slightly smaller in outer dimensions than the thin plate 151, and has a thickness of 1–2 mm and is formed of iron. A recessed groove 153 is formed at a part corresponding to the opening 156 of the thin plate 151, which is larger than the opening 156 in plane and has a depth of 0.5 mm. Comparing a case with the groove 153 in the reinforcing member 152 with a case without the groove 153, an outline of the openings 156 is more clearly recognizable by the CCD camera 175, when the groove 153 is formed. The reason for this will be explained as follows. If the groove 153 is not formed in the reinforcing member 152 as in FIG. 9, a light 201 entering to irradiate an inner wall face 202 of the opening 156 is reflected at the reinforcing member 152 and returned toward the CCD camera 175. Additionally, a light 203 entering the reinforcing member 152 directly through the opening 156 is sometimes reflected by the reinforcing member 152 and the inner wall face 202 to be returned toward the CCD camera 175. On the other hand, when the groove 153 is formed as shown in FIG. 10, the light 201 entering to irradiate the inner wall face 202 of the opening 156 is reflected toward the groove 153 and not returned toward the CCD camera 175. Because of the presence of the groove 153, unnecessary light never enters the CCD camera 175. That is, the groove 153 works to let the CCD camera 175 recognize the outline of the opening 156 more distinctly.

The groove 153 is made larger in plane than the opening 156 so as to work the above-mentioned action, as described earlier. In other words, the groove 153 is required to be so large as not to be in touch with a circumference 157 of the opening 156 at the side of the reinforcing member 152, as in FIG. 10. According to the embodiment, the groove 153 is formed concentrically with the openings 156, and a diameter III of the groove 153 is approximately twice the diameter of the opening 156, more specifically, 0.4–1 mm in the present embodiment.

An inner face of the groove 153 is applied, e.g., in black to hardly reflect the light from the LED illuminator 171 of the component recognition device 107. Therefore, in a state with the reinforcing member 152 bonded to the thin plate 151, the light advancing through the opening 151 to the groove 153 is not reflected at the inner face of the groove 153.

The above construction improves the dark-bright contrast between the picked-up face 151a of the thin plate 151 and the opening 156.

The groove 153 is not formed at a central part 155 of the reinforcing member 152, and therefore the central part 155 can support the thin plate 151.

Figure 11:
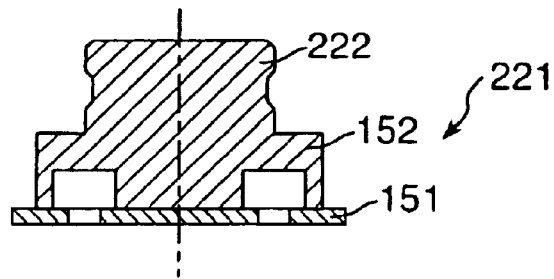
FIG. 11 is a diagram of another example of the calibration jig of FIG. 1.

The thus-constituted calibration jig 150 is directly sucked and held by the nozzle 110 of the component holding device 106 as will be discussed later. However, in the case where the nozzle is rendered detachable from the component holding device 106, a detachment member 222, and the thin plate 151, and the reinforcing member 152 can be formed integrally into a calibration jig 221 shown in FIG. 11.

Figure 12:
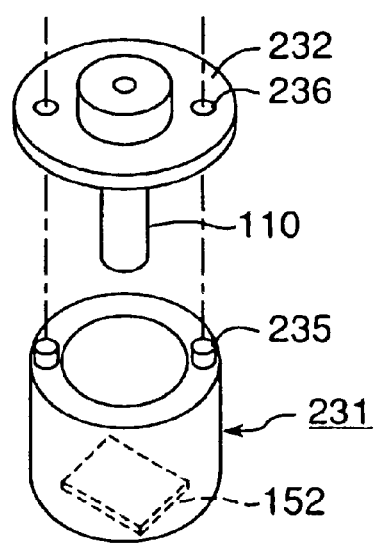
FIG. 12 is a perspective view of a different example of the calibration jig of FIG. 1.
Figure 13:
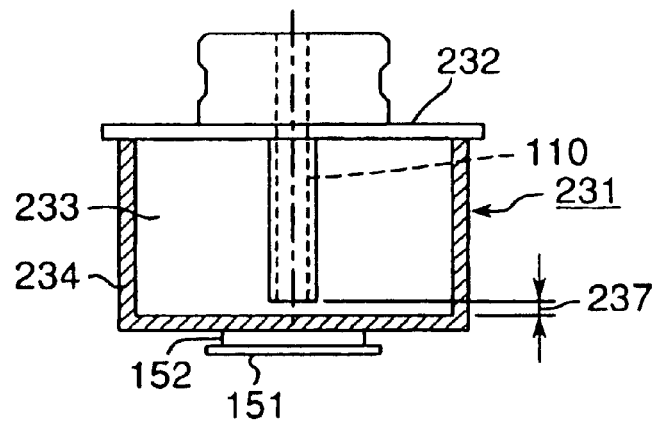
FIG. 13 is a sectional view of a state where the calibration jig of FIG. 12 is fitted to a nozzle.

Moreover, the calibration jig 150 may be adapted to be sucked indirectly as shown in FIGS. 12 and 13. That is, a calibration jig 231 of the type is composed of a cup-like nozzle cover 234 forming a suction chamber 233 through contact with a flange part 232 of the nozzle 110, the thin plate 151 and reinforcing member 152 set at a bottom face of the nozzle cover 234 and, projecting parts 235. The nozzle 110 can be inserted into the nozzle cover 234. Holes 236 to be engaged with the projecting parts 235 are formed in the flange part 232.

In a state with the nozzle 110 inserted into the suction chamber 233 in the calibration jig 231, a gap 237 is formed between a leading end of the nozzle 110 and a bottom face inside the suction chamber 233. The suction by the nozzle 110 turns the interior of the suction chamber 233 into a negative pressure, so that the flange part 232 and nozzle cover 234 are tightly in contact with each other, and accordingly the calibration jig 231 is fitted to the nozzle 110. The projecting parts 235 and holes 236 are a guide member for positioning the nozzle 110 and the calibration jig 231 roughly to prevent the flange part 232 and nozzle cover 234 from shifting greatly and disenabling the suction chamber 233 to be turned to the negative pressure.

The calibration jig 231, as described above, exerts the following effects.

The calibration jig 150 is large relative to the electronic component sucked and held by the component holding device 106 of the component mounting apparatus 100. Therefore, a special suction nozzle for sucking and holding of the calibration jig 150 is needed in some cases, although a use frequency of this special suction nozzle for the calibration jig 150 is considerably low in comparison with the electronic component suction nozzle. From the viewpoint of the structure of the apparatus, it is not preferable to provide the special suction nozzle for the calibration jig 150.

In the meantime, if the above-described calibration jig 231 is used, the electronic component suction nozzle can suck and hold the calibration jig, thereby eliminating the need for the special suction nozzle for the calibration jig 150.

Figure 8:
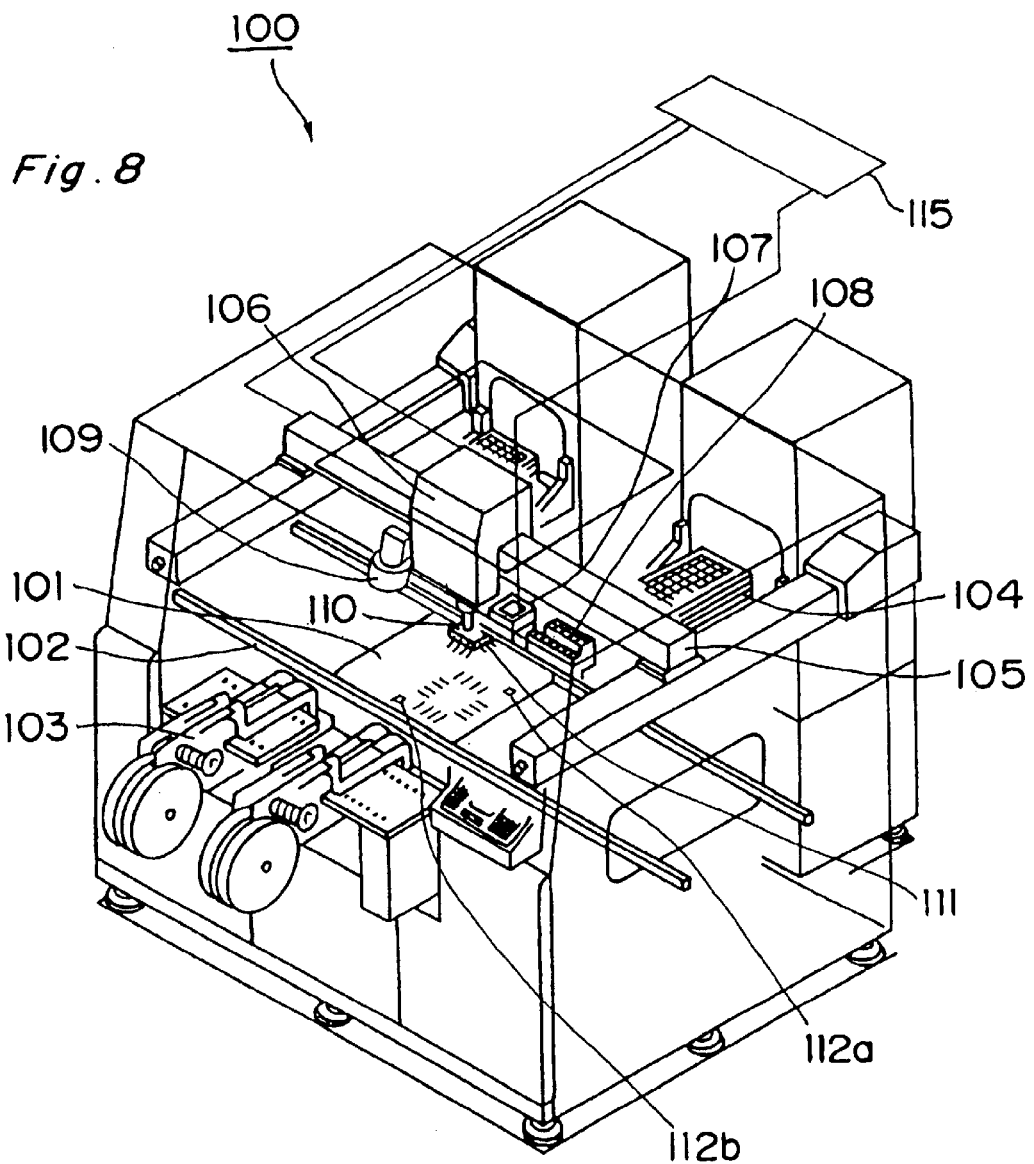
FIG. 8 is a perspective view of a component mounting apparatus to be calibrated with the use of the calibration jig of FIG. 1.

The above calibration jig 150 is used in the component mounting apparatus 100 constituted as in FIG. 8 according to the embodiment.

The component mounting apparatus 100 for mounting electronic components includes a board transfer device 102 for carrying in and out a circuit board 101 and holding the circuit board when an electronic component is mounted to the board, a reel-type electronic component feed device 103 or a tray-type electronic component feed device 104 storing electronic components to be mounted, the component holding device 106 which can be moved in X, Y directions by an XY robot 105 to set the electronic component held from at least either the electronic component feed device 103 or the electronic component feed device 104 to a mount position on the circuit board 101, the component recognition device 107 for picking up an image and measuring an attitude of the electronic component held by the component holding device 106, and a control device 115 for controlling operations of at least the XY robot 105, component holding device 106 and component recognition device 107. The component holding device 106 is provided with the nozzle 110 for holding an electronic component 111, e.g., by sucking, and a board recognition camera 109 for picking up and recognizing board marks 112a, 112b marked at the mount position on the circuit board 101. A reference numeral 108 is a nozzle station where the nozzle 110 of the component holding device 106, the calibration jig, etc., are disposed.

As indicated in FIG. 1, the component recognition device 107 has the LED illuminator 171 for illuminating the calibration jig 150 held by the nozzle 110 and the electronic component 111 in order to pick up images thereof, a mirror 173 and a lens 174 arranged on an optical path of a light reflected by the jig 150 or component 111, and the CCD camera 175 for detecting a light passing the lens 174. The LED illumination 171 is connected to an illumination device 1.72 and the CCD camera 175 is connected to an image processing device 176. The image processing device 176 operates information, which is required to calibrate the component recognition device 107 with the use of the calibration jig 150, such as a rotational angle of the camera, etc. to be described later and then sends out an operation result to the control device 115. The calibration operation will be described in detail later. The control device 115 controls an attitude of the component 111 held by the nozzle 110 of the component holding device 106 with the information of the rotational angle, etc., taken into account as will be depicted later.

In the component recognition device 107, for instance, the light of the LED illuminator 171 reflected at the calibration jig 150 is condensed via the mirror 173 by the lens 174, so that an image of the calibration jig 150 is picked up by the CCD camera 175. A reference numeral 177 denotes an optical axis.

Now, the operation of the component mounting apparatus 100 will be described below primarily in relation to the calibration operation of the component recognition device 107 with the use of the calibration jig 150.

Before the electronic component 111 is started to be mounted on the circuit board 101, the component recognition device 107 should be calibrated first. As previously discussed, the calibration of the component recognition device 107 consists of a measurement of the resolution of the CCD camera 175 of the component recognition device 107, the rotational angle of the component recognition device 107 and the center position of the view field of the CCD camera 175, and a succeeding correction of the rotational angle and the movement amount of the sucked component by the component holding device 106 on the basis of those measured values. Each measurement operation will be described specifically hereinbelow with reference to FIG. 14.

Figure 3:
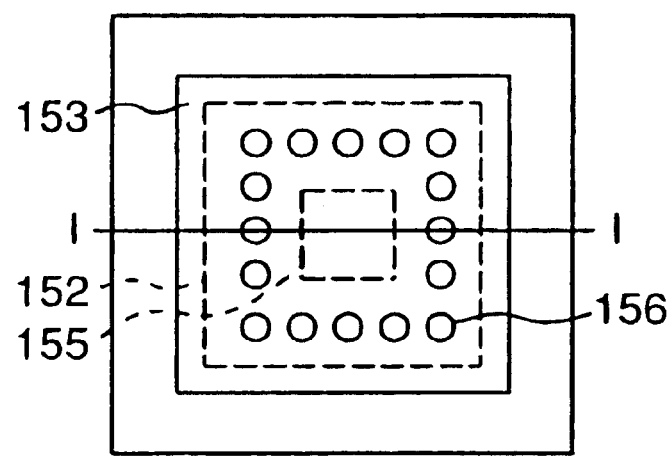
FIG. 3 is a diagram of an image of the calibration jig picked up by the component recognition device of FIG. 1.
Figure 4:
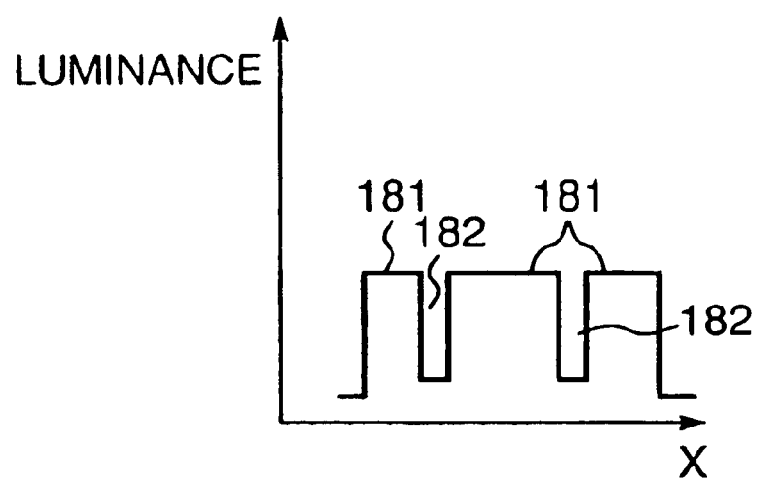
FIG. 4 is a graph of a luminance distribution at an I—I part of FIG. 3.
Figure 14:
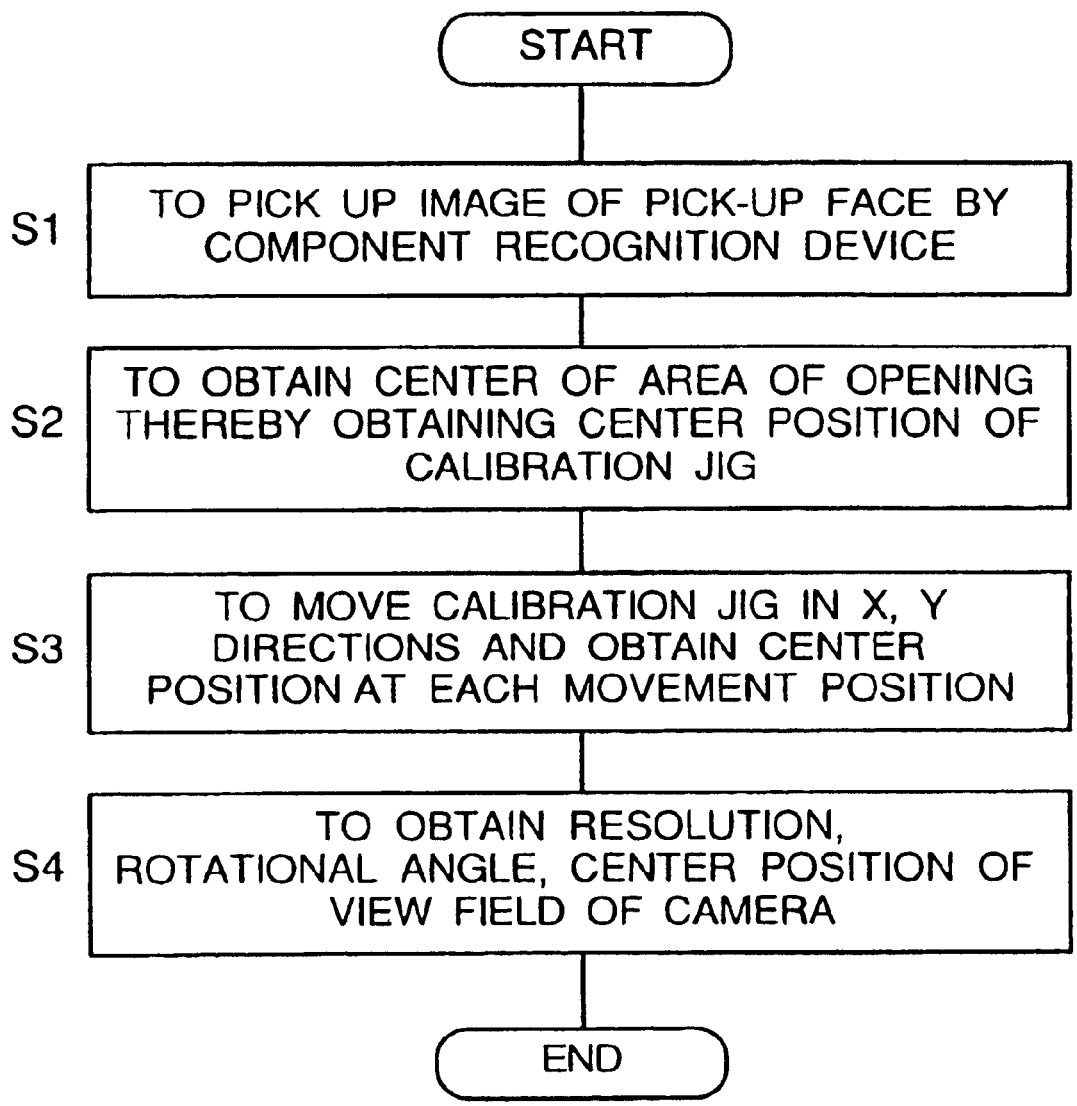
FIG. 14 is a flow chart of a component recognition calibration operation with the use of the calibration jig of FIG. 1.
Figure 15:
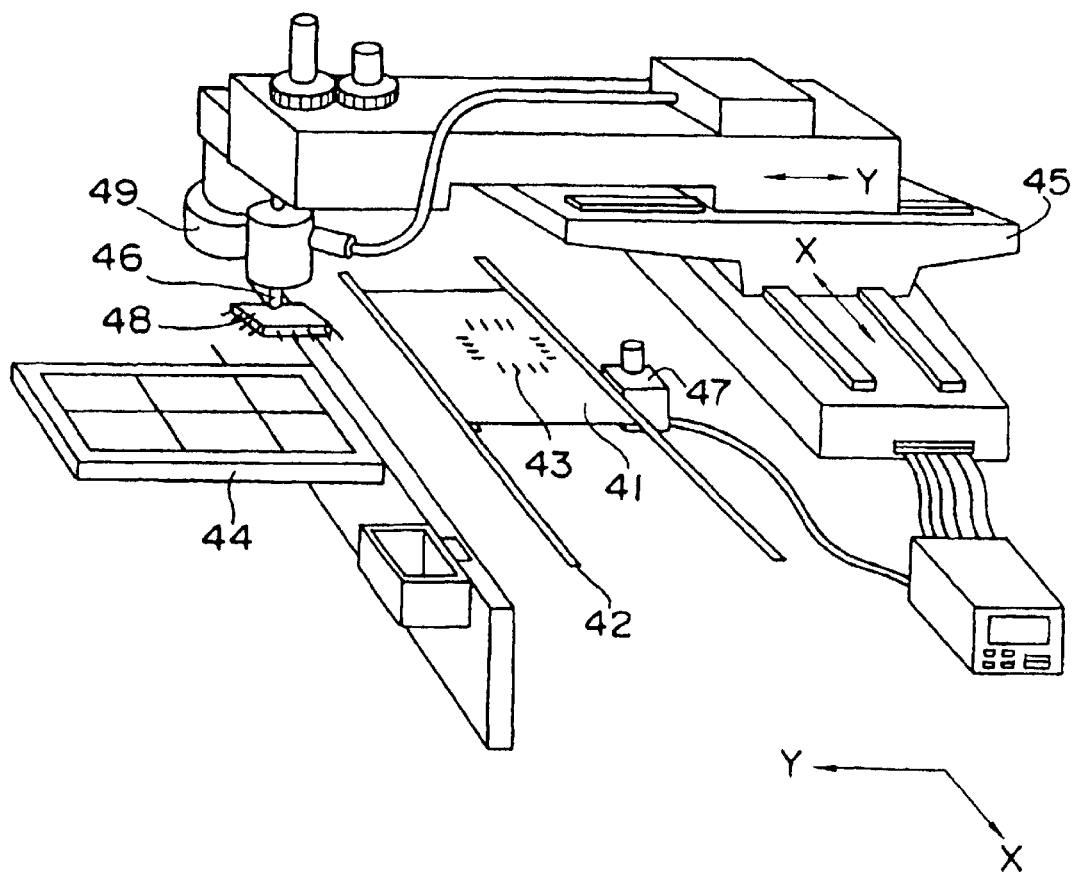
FIG. 15 is a perspective view of a conventional component mounting apparatus.
Figure 16:
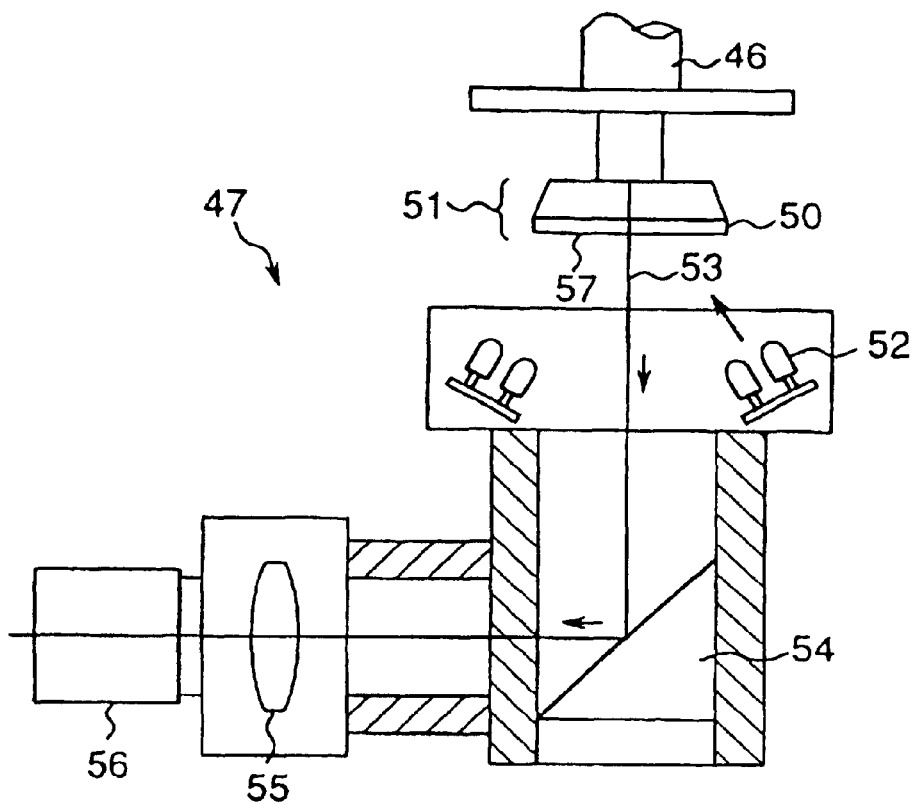
FIG. 16 is a diagram of a conventional calibration jig, and a component recognition device photographing the jig.
Figure 17:
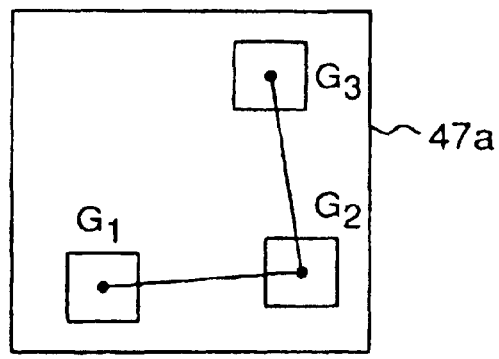
FIG. 17 is a diagram explanatory of how to obtain a rotational angle and a resolution of a camera with the use of the calibration jig of FIG. 16.
Figure 18:
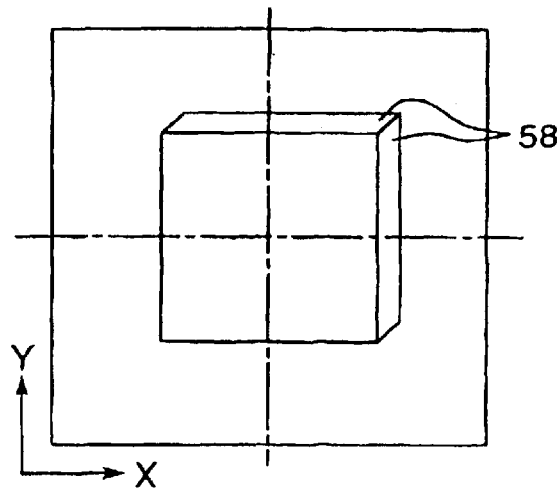
FIG. 18 is a diagram of an image of the calibration jig of FIG. 16.
Figure 19:
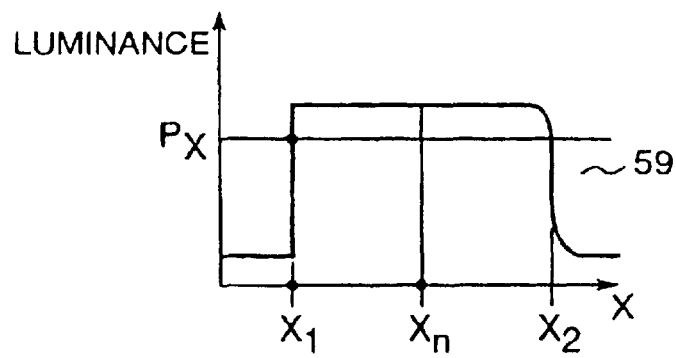
FIG. 19 is a graph of a luminance level of the image in an X direction of the calibration jig of FIG. 16.
Figure 20:
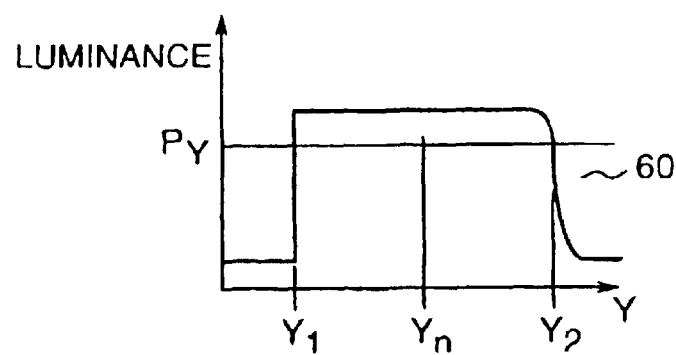
FIG. 20 is a graph of a luminance level of the image in a Y direction of the calibration jig of FIG. 16.

In step 1 in FIG. 14 ("S" in the drawing is an abbreviation of "step"), the picked-up face 151a of the calibration jig 150 is photographed by the component recognition device 107. FIG. 3 is a diagram of a state when the picked-up face 151a of the calibration jig 150 is photographed by the component recognition device 107. FIG. 4 is a graph of a luminance level of an image along a line I—I of FIG. 3. The image in FIG. 4 is expressed by 256 gradations of the luminance from a darkest part to a brightest part, more specifically, a part designated by a reference numeral 181 corresponds to the picked-up face 151a faced with the satinfinish, and a part of a reference numeral 182 corresponds to the opening 156. Since the calibration jig 150 of the above-described construction is used in the embodiment, a boundary between the bright and dark parts is made clear as in FIG. 4, whereby the part of the opening 156 can be recognized surely and clearly through processing of the image.

Figure 5:
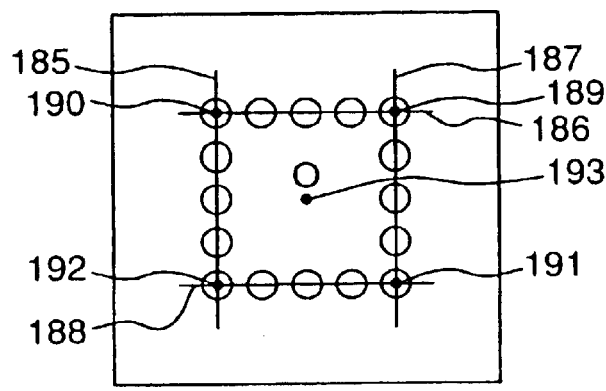
FIG. 5 is a diagram explanatory of how to obtain a center of a frame formed by openings of the calibration jig of FIG. 1.

In step 2, the center position of the calibration jig 150 is obtained. That is, the center position of each opening 156 is detected as the center of the area of each opening 156. The outline of the opening 156 of the calibration jig 150 of the embodiment is clearly recognized in the image obtained by the component recognition device 107, so that information of each position described below and the center position can be specified correctly. Regarding each of four rows of the openings 156 aligned along the rectangular outline, each line 185–188 is obtained as in FIG. 5 on the basis of center positions of openings 156 in each row according to an approximation of least squares. Further, intersections 189–192 of the lines 185–188 are obtained on the basis of the lines 185–188, based on the intersections 189–192 a center position 193 of the rectangular shape formed by the alignment of the openings 156<is obtained. The center position 193 corresponds to the point to be measured of the calibration jig 150.

Figure 6:
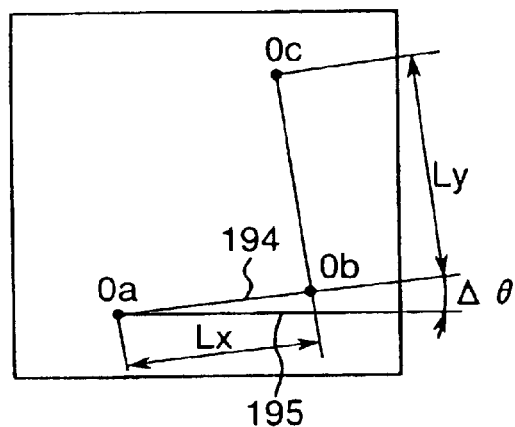
FIG. 6 is a diagram explanatory of how to obtain a rotational angle and a resolution of a camera.

After the center position 193 is detected, in step 3, the component holding device 106 holding the calibration jig 150 is moved over the component recognition device 107 in X, Y directions and, each center position 193 is obtained at each movement position in the above manner. Supposing that the center position 193 changes from Oa→Ob→Oc through the above movement in X, Y directions as shown in FIG. 6, the rotational angle and the resolution scale of the camera are obtained in step 4 in a manner as follows. That is, while it is naturally ideal that a horizontal line in the image obtained by the component recognition device 107 is coincident with, e.g., X direction of the XY robot 105, actually there is present a slight error and the error corresponds to the rotational angle of the camera. Therefore, an angle $\Delta\Theta$ defined by a line 194 connecting the Oa and Ob and a horizontal line 195 of the component recognition device 107 is obtained on the basis of position information of the Oa and Ob. The angle $\Delta\Theta$ corresponds to the rotational angle of the camera, i.e., the rotational angle of the component recognition device 107.

The resolution scale of the CCD camera 175 can be easily calculated from a movement amount on a screen of the component recognition device 107 and an actual movement amount of the nozzle 110. Specifically, a ratio of a distance Lx between the Oa and Ob when the component holding device 106 is moved in the X direction, and a distance between the Oa and Ob on the image, and also a ratio of a distance Ly between the Ob and Oc when the component holding device 106 is moved in the Y direction, and a distance between the Ob and Oc on the image are obtained, which are set as the resolution scale of the camera.

Figure 7:
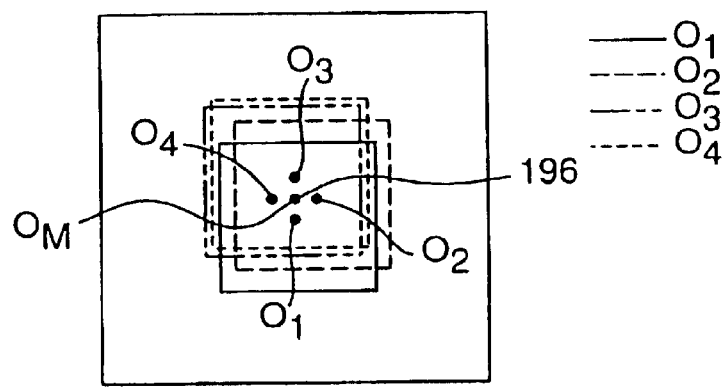
FIG. 7 is a diagram explanatory of how to obtain a center of a view field of the component recognition device of FIG. 1.

According to the embodiment, in the coordinate system of the component holding device 106, a rotational center in the rotation about the axis of the nozzle 110 is a bench mark. Therefore, in order to position the electronic component 111 correctly to the mount position on the circuit board 101, the rotational center of the nozzle 110 should agree with a center of the electronic component 111 held by the nozzle 110 and moreover agree with a center of the view field of the component recognition device 107. However, a slight offset is sometimes brought about therebetween and should be corrected. For the correction, as shown in FIG. 7, the calibration jig 150 held by the nozzle 110 is rotated every 90° over the, component recognition device 107 by rotating the nozzle 110 about its axis by every 90°, whereby positions O1, O2, O3, O4 corresponding to each center position 193 in the every 90° are recognized at every rotation. A coordinate value of the rotational center 196 of the nozzle 110 is calculated from an average of X coordinate values at the positions O1–O4 and an average of Y coordinate values at the positions O1–O4.

A coordinate value of the center of the view field of the component recognition device 107 can be similarly calculated, for example, by photographing a face to be photographed of the component recognition device 107, e.g., by the board recognition camera 109 of the component holding device 106.

The offset value of the center of the view field of the component recognition device 107 is calculated from the above information according to an equation below.

Offset value=(coordinate value of nozzle 110 of component holding device 106 of XY robot 105 at measurement time)–(coordinate value of rotational center 196 of nozzle 110)–(coordinate value of center of view field of component recognition device 107).

The operation of mounting the component is carried out in compliance with the control by the control device 115 in consideration of the rotational angle and resolution scale of the camera of the component recognition device 107 and the offset value of the center of the view field obtained as above taken in account. Specifically, the circuit board 101 is transferred to a mount place by the board transfer device 102. The component holding device 106 is arranged above the circuit board 101 by the XY robot 105, and board marks 112a, 112b on the circuit board 101 are picked up by the board recognition camera 109 set in the component holding device 106, thereby recognizing a position where the electronic component 111 is to be mounted. Then, the XY robot 105 moves the component holding device 106 to, e.g., over the component feed device 103 to hold the electronic component 111 by the nozzle 110, e.g., by sucking. After the electronic component 111 held by the nozzle 110 is arranged by the XY robot 105 above the face to be photographed of the component recognition device 107, the component holding device 106 moves down the nozzle 110 to a focus face of the component recognition device 107. The electronic component 111 is illuminated by the LED illuminator 171 of the component recognition device 107. The image picked by the CCD camera 175 is sent to the image processing device 176. The image processing device 176 operates an attitude of the sucked electronic component 111 with the use of the center position 193, rotational angle be of the camera, resolution of the CCD camera 175 and offset value of the center of the view field at the component recognition device 107. The control device 115 consequently corrects the operation of the XY robot 105 and component holding device 106 based on the operation result supplied from the image processing device 176, to mount the electronic component 111 held by the nozzle 110 to the circuit board 101. The same operation is executed for each subsequent electronic component 111.

In the embodiment-using the calibration jig 150, the component recognition device 107 can clearly recognize the bright-dark contrast of the jig 150. The rotational angle of the camera, resolution and offset value of the center of the view field of the camera of the component recognition device 107 can be correctly obtained. Accordingly, the component holding device 106 can be corrected with higher accuracy as compared with the conventional art. The component is hence correctly mounted to the board.

The calibration jig 150 in the above embodiment comprises the thin plate 151 and reinforcing member 152. The reinforcing member 152 may be eliminated if the thin plate 151 has high strength. In such case, a recess-shaped member having an inner face applied, e.g., in black should be set at a position corresponding to the openings 156 at the rear side of the picked-up face 151a so as to suppress the reflection of light, thereby obtaining the clear contrast between the picked-up face 151a and openings 156.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A calibration jig for a component recognition device to be used in making a coordinate system within a view field of the component recognition device provided for confirming an attitude of a component before the component is mounted to a to-be-mounted object; and agreement with a coordinate system of a component holding device for holding and mounting the component to the object, said calibration jig comprising:

a plate having a flat face for reflecting light to be received by the component recognition device, and a recognition part for obtaining a point on the flat face, said recognition part being located at the flat face, and the point being necessary for confirming the agreement of the coordinate systems, said recognition part being arranged within a periphery of the flat face, and having a light reflectance that is different from that of the flat face; and a reinforcing member for reinforcing said plate, said reinforcing member being disposed at an opposite face of said plate relative to the flat face, said recognition part comprising an opening formed in the flat face, wherein said reinforcing member has a recessed part that is formed so as to correspond to the opening; the recessed part permitting the component recognition device to recognize a clear outline of the opening, and wherein the recessed part of the reinforcing member has an inner face that is dark or colored black in order to suppress the reflection of light.

2. A calibration jig for a component recognition device as claimed in claim 1, wherein said recessed part is larger in plane than the opening.

3. A calibration jig for a component recognition device as claimed in claim 1, wherein the flat face has a rectangular shape, and the opening comprises at least four openings formed at four points that correspond to four corners of the flat face.

4. A calibration jig for a component recognition device as claimed in claim 1, wherein the opening comprises at least one opening formed at an optional position on the flat face which has a rectangular shape.

5. A component mounting apparatus for handling the calibration jig for the component recognition device as claimed in claim 1.

6. A component mounting apparatus for handling the calibration jig for the component recognition device as claimed in claim 2.

7. A component mounting apparatus for handling the calibration jig for the component recognition device as claimed in claim 3.

8. A component mounting apparatus for handling the calibration jig for the component recognition device as claimed in claim 4.

9. A component mounting apparatus as claimed in claim 5, wherein the component recognition device is operable to illuminate the flat face of the calibration jig thus recognizing the recognition part, and is provided with an image processing device which obtains a position of the recognition part through the recognition of the recognition part, calculates at least a resolution of the component recognition device based on the obtained position, and calculates a rotational angle representing a shift of the coordinate system of the component recognition device relative to the coordinate system of the component holding device.

10. A component mounting apparatus as claimed in claim 6, wherein the component recognition device is operable to illuminate the flat face of the calibration jig thus recognizing the recognition part, and is provided with an image processing device which is operable to obtain a position of the recognition part through the recognition of the recognition part, calculate at least a resolution of the component recognition device based on a result of the obtained position, and calculate a rotational angle representing a shift of the coordinate system of the component recognition device relative to the coordinate system of the component holding device.

11. A component mounting apparatus as claimed in claim 7, wherein the component recognition device is operable to illuminate the flat face of the calibration jig thus recognizing the recognition part, and is provided with an image processing device which is operable to obtain a position of the recognition part through the recognition of the recognition part, calculate at least a resolution of the component recognition device based on a result of the obtained position, and calculate a rotational angle representing a shift of the coordinate system of the component recognition device relative to the coordinate system of the component holding device.

12. A component mounting apparatus as claimed in claim 8, wherein the component recognition device is operable to illuminate the flat face of the calibration jig thus recognizing the recognition part, and is provided with an image processing device which is operable to obtain a position of the recognition part through the recognition of the recognition part, calculate at least a resolution of the component recognition device based on a result of the obtained position, and calculate a rotational angle representing a shift of the coordinate system of the component recognition device relative to the coordinate system of the component holding device.

13. A component recognition calibration method using the calibration jig for the component recognition device as claimed in claim 1, the method comprising:

illuminating the flat face of the calibration jig;

recognizing the recognition part by the component recognition device thus obtaining a position of the recognition part;

calculating a resolution of the component recognition device on the basis of the obtained position of the recognition part; and calculating a rotational angle representing a shift of the coordinate system of the component recognition device relative to the coordinate system of the component holding device.

14. A component recognition calibration method using the calibration jig for the component recognition device as claimed in claim 2, the method comprising:

illuminating the flat face of the calibration jig;

recognizing the recognition part by the component recognition device thus obtaining a position of the recognition part;

calculating a resolution of the component recognition device on a basis of the obtained position of the recognition part; and calculating a rotational angle representing a shift of the coordinate system of the component recognition device relative to the coordinate system of the component holding device.

15. A component recognition calibration method using the calibration jig for the component recognition device as claimed in claim 3, the method comprising:

illuminating the flat face of the calibration jig;

recognizing the recognition part by the component recognition device thus obtaining a position of the recognition part;

calculating a resolution of the component recognition device on a basis of the obtained position of the recognition part; and calculating a rotational angle representing a shift of the coordinate system of the component recognition device relative to the coordinate system of the component holding device.

16. A component recognition calibration method using the calibration jig for the component recognition device as claimed in claim 4, the method comprising:

illuminating the flat face of the calibration jig;

recognizing the recognition part by the component recognition device thus obtaining a position of the recognition part;

calculating a resolution of the component recognition device on a basis of the obtained position of the recognition part; and calculating a rotational angle representing a shift of the coordinate system of the component recognition device to the coordinate system of the component holding device.

17. A component recognition calibration method as claimed in claim 13, wherein the calculating of the resolution of the component recognition device and the rotational angle comprises:

obtaining the point to be measured of the calibration jig on the basis of the obtained position of the recognition part;

thereafter, moving the calibration jig over the component recognition device in X, Y directions orthogonal to each other on a plane;

calculating the resolution of the component recognition device from a movement distance of the point to be measured and an actual movement distance, the movement distance being obtained by the component recognition device based on a locus of the point to be measured; and calculating the rotational angle from a shift of a movement direction in the X or Y direction of the point to be measured to a regulated X-axis or Y-axis.

18. A component recognition calibration method as claimed in claim 14, wherein the calculating of the resolution of the component recognition device and the rotational angle comprises:

obtaining the point to be measured of the calibration jig on the basis of the obtained position of the recognition part;

thereafter, moving the calibration jig over the component recognition device in X, Y directions orthogonal to each other on a plane;

calculating the resolution of the component recognition device from a movement distance of the point to be measured and an actual movement distance, the movement distance being obtained by the component recognition device based on a locus of the point to be measured; and calculating the rotational angle from a shift of a movement direction in the X or Y direction of the point to be measured to a regulated X-axis or Y-axis.

19. A component recognition calibration method as claimed in claim 15, wherein the calculating of the resolution of the component recognition device and the rotational angle comprises:

obtaining the point to be measured of the calibration jig on the basis of the obtained position of the recognition part;

thereafter, moving the calibration jig over the component recognition device in X, Y directions orthogonal to each other on a plane;

calculating the resolution of the component recognition device from a movement distance of the point to be measured and an actual movement distance, the movement distance being obtained by the component recognition device based on a locus of the point to be measured; and calculating the rotational angle from a shift of a movement direction in the X or Y direction of the point to be measured to a regulated X-axis or Y-axis.

20. A component recognition calibration method as claimed in claim 16, wherein the calculating of the resolution of the component recognition device and the rotational angle comprises:

obtaining the point to be measured of the calibration jig on the basis of the obtained position of the recognition part;

thereafter, moving the calibration jig over the component recognition device in X, Y directions orthogonal to each other on a plane;

calculating the resolution of the component recognition device from a movement distance of the point to be measured and an actual movement distance, the movement distance being obtained by the component recognition device based on a locus of the point to be measured; and calculating the rotational angle from a shift of a movement direction in the X or Y direction of the point to be measured to a regulated X-axis or Y-axis.

* * * * *